(12) United States Patent
Avinash et al.

(10) Patent No.: US 8,687,870 B2
(45) Date of Patent: Apr. 1, 2014

(54) SYSTEM AND METHOD FOR CORRECTING INHOMOGENEITY OF SPATIAL INTENSITY IN 3D MR IMAGE DATA

(75) Inventors: Gopal Biligeri Avinash, Menomonee Falls, WI (US); Zhongmin S. Lin, New Berlin, WI (US)

(73) Assignee: General Electric Company, Schenectady, NY (US)

( * ) Notice: Subject to any disclaimer, the term of this patent is extended or adjusted under 35 U.S.C. 154(b) by 872 days.

(21) Appl. No.: 12/843,938

(22) Filed: Jul. 27, 2010

(65) Prior Publication Data
US 2012/0027279 A1 Feb. 2, 2012

(51) Int. Cl.
G06K 9/00 (2006.01)

(52) U.S. Cl.
USPC .............. 382/131; 382/275; 324/309

(58) Field of Classification Search
None
See application file for complete search history.

(56) References Cited

U.S. PATENT DOCUMENTS

| 5,600,244 | A | 2/1997 | Jensen et al. | |
|---|---|---|---|---|
| 5,943,433 | A | 8/1999 | Avinash | |
| 7,542,622 | B1 * | 6/2009 | Angelini et al. | 382/275 |
| 2009/0092305 | A1 * | 4/2009 | Ditt et al. | 382/131 |
| 2010/0085050 | A1 * | 4/2010 | Dong et al. | 324/309 |

OTHER PUBLICATIONS

Moyher et al., "Surface Coil MR Imaging of the Human Brain with an Analytic Reception Profile Correction," JMRI, vol. 5, No. 2, Mar./Apr. 1995, pp. 139-144.
Wald et al., "Phased Array Detectors and an Automated Intensity Correction Algorithm for High Resolution MR Imaging of the Human Brain," Magnetic Resonance in Medicine, pp. 1-20, Sep. 1995.
Murakami, "Phased Array Image Intensity Correction: An Algorithm to Remove Intensity Variations in Magnetic Resonance Images Resulting from the Inhomogeneous Sensitivity Profiles of Phased Array Coils," Thesis, 1995.
Murakami et al. "Intensity Correction of Phased-Array Surface Coil Images," MRM, vol. 35, 1996, pp. 585-590.
Meyer et al., "Retrospective Correction of Intensity Inhomogeneities in MRI," IEEE Transactions on Medical Imaging, vol. 14, No. 1, Mar. 1995, pp. 36-43.
Dawant et al., "Correction of Intensity Variations in MR Images for Computer-Aided Tissue Classification," IEEE Transactions on Medical Imaging, vol. 12, No. 4, Dec. 1993, pp. 770-781.

* cited by examiner

Primary Examiner — Valerie Lubin
(74) Attorney, Agent, or Firm — Ziolkowski Patent Solutions Group, SC

(57) ABSTRACT

A system and method for correcting inhomogeneity of spatial intensity in 3D MR image data includes application of a 3D filter to the 3D MR image to generate a first set of data and a second set of data. The first set of data includes a high frequency component and a weak edge component, and the second set of data includes a low frequency component and a strong edge component. The system and method also include derivation of an inhomogeneity correction from the second set of data, application the inhomogeneity correction to the second set of data, and addition of the first set of data to the inhomogeneity corrected second set of data to create a corrected 3D MR image.

20 Claims, 5 Drawing Sheets

SYSTEM AND METHOD FOR CORRECTING INHOMOGENEITY OF SPATIAL INTENSITY IN 3D MR IMAGE DATA

BACKGROUND OF THE INVENTION

Embodiments of the invention relate generally to diagnostic imaging and, more particularly, to a system and method for correcting inhomogeneity of spatial intensity in three-dimensional (3D) magnetic resonance (MR) image data.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization," $M_Z$, may be rotated, or "tipped," into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals is digitized and processed to reconstruct the image using one of many well known reconstruction techniques.

Acquired MR images are corrupted by slowly varying multiplicative inhomogeneities or nonuniformities in spatial intensity. These nonuniformities are especially severe for 3 T (three tesla) MR images and introduce shading artifacts that decrease image quality and may cause clinical misinterpretation.

Two primary methods are used to correct MR image inhomogeneity. The first is a calibration-based method that uses a low-resolution body coil image for the correction. The quality of the correction depends on the quality of the low-resolution body coil image. For 3 T MR applications, the quality of the correction based on a low-resolution body coil image is generally less than optimum.

The second method is a post-processing step that applies an algorithm for inhomogeneity correction. Various intensity correction algorithms have been devised to correct for shading artifacts. Thus, if the observed or acquired MR image signal is defined in a spatial domain for a voxel location (x,y,z) by the function g(x,y,z) as g(x,y,z)=h(x,y,z)*f(x,y,z)+n(x,y,z), where * represents multiplication, h represents the coil profile function, f represents a corrected function, and n represents imaging noise. However, noise is amplified while solving such a multiplicative image formation model. That is, given the acquired data, g, and the transformation, h, the corrected function, f, is solved for in the presence of noise, n. Known methods address noise either by simply ignoring noise amplification, suppressing noise prior to performing inhomogeneity correction, or using methods similar to a Weiner filter to suppress the amplification of noise. However, with all of these techniques, the areas having the highest inhomogeneity correction also have the highest noise amplification. Further, known methods of inhomogeneity correction can produce unsatisfactory results when applied to 3D image data.

Accordingly, it would be desirable to have a system and method capable of correcting inhomogeneity in 3D MR images while reducing or eliminating noise amplification.

BRIEF DESCRIPTION OF THE INVENTION

Embodiments of the invention provide a system and method of correcting inhomogeneity of spatial intensity in 3D MR image data.

In accordance with one aspect of the invention, a computer readable storage medium has stored thereon a computer program comprising instructions which when executed by a computer cause the computer to access a three-dimensional (3D) magnetic resonance (MR) image. The instructions also cause the computer to apply a 3D filter to the 3D MR image to generate a first set of data and a second set of data. The first set of data includes a high frequency component and a weak edge component, and the second set of data includes a low frequency component and a strong edge component. Further, the instructions cause the computer to derive an inhomogeneity correction from the second set of data, apply the inhomogeneity correction to the second set of data, and add the first set of data to the inhomogeneity corrected second set of data to create a corrected 3D MR image.

In accordance with another aspect of the invention, a method for correcting inhomogeneity in three-dimensional (3D) magnetic resonance (MR) image data includes accessing a set of 3D MR image data at a first resolution and applying a first filter to the set of 3D MR image data to isolate a first set of data and a second set of data. The first set of data includes high frequency data and the second set of data includes low frequency data and salient edge data. The method also includes computing a 3D inhomogeneity correction function from the second set of data, three-dimensionally correcting the second set of data using the 3D inhomogeneity correction function, and combining the corrected second set of data with the first set of data to generate a corrected 3D image.

In accordance with yet another aspect of the invention, an MRI apparatus includes a magnetic resonance imaging (MRI) system having a plurality of gradient coils positioned about a bore of a magnet, and an RF transceiver system and an RF switch controlled by a pulse module to transmit RF signals to an RF coil assembly to acquire three-dimensional (3D) MR images. The MRI apparatus further includes a computer that is programmed to access an image acquired from the MRI system and apply a 3D edge preserving filter to the image to generate a pair of datasets, the pair of datasets comprising a first dataset and a second dataset. The first dataset includes high frequency data and weak edge data, and the second dataset includes low frequency data and strong edge data. The computer is also programmed to apply a 3D inhomogeneity correction to only the second dataset to obtain a corrected second dataset, combine the first dataset with the corrected second dataset, and display a corrected 3D MR image from the combined first and corrected second datasets.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Figure 1:
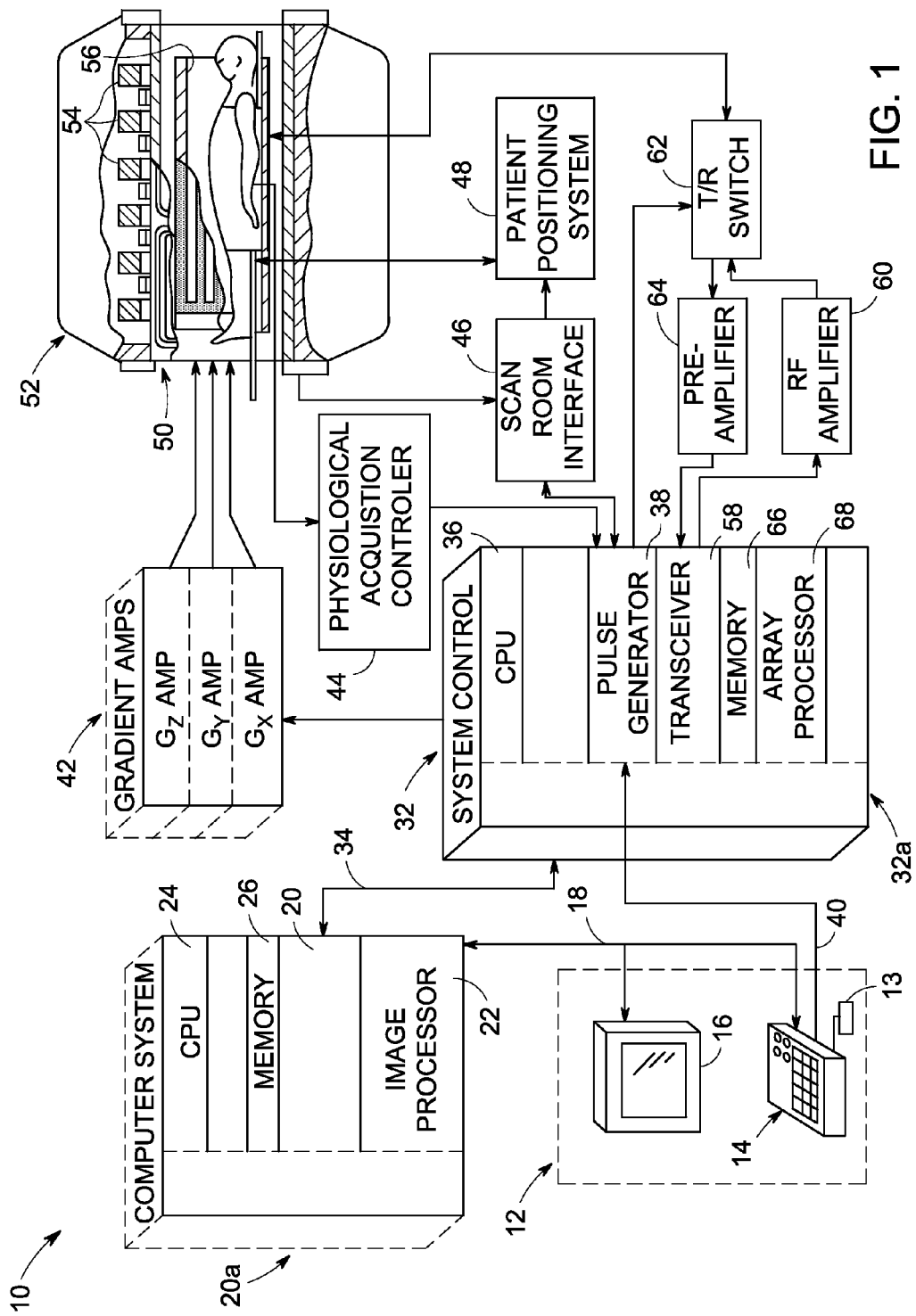
FIG. 1 is a schematic block diagram of an exemplary MR imaging system for use with embodiments of the invention.

Referring to FIG. 1, the major components of a magnetic resonance imaging (MRI) system 10 incorporating an embodiment of the invention are shown. The operation of the system is controlled for certain functions from an operator console 12 which in this example includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These modules include an image processor module 22, a CPU module 24 and a memory module 26, known in the art as a frame buffer for storing image data arrays. The computer system 20 communicates with a separate system control 32 through a high speed serial link 34. The input device 13 can include a mouse, joystick, keyboard, track ball, touch activated screen, light wand, voice control, card reader, push-button, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12 or as otherwise directed by the system software, this image data may be archived in long term storage or it may be further processed by the image processor 22 and conveyed to the operator console 12 and presented on the display 16.

Figure 2:
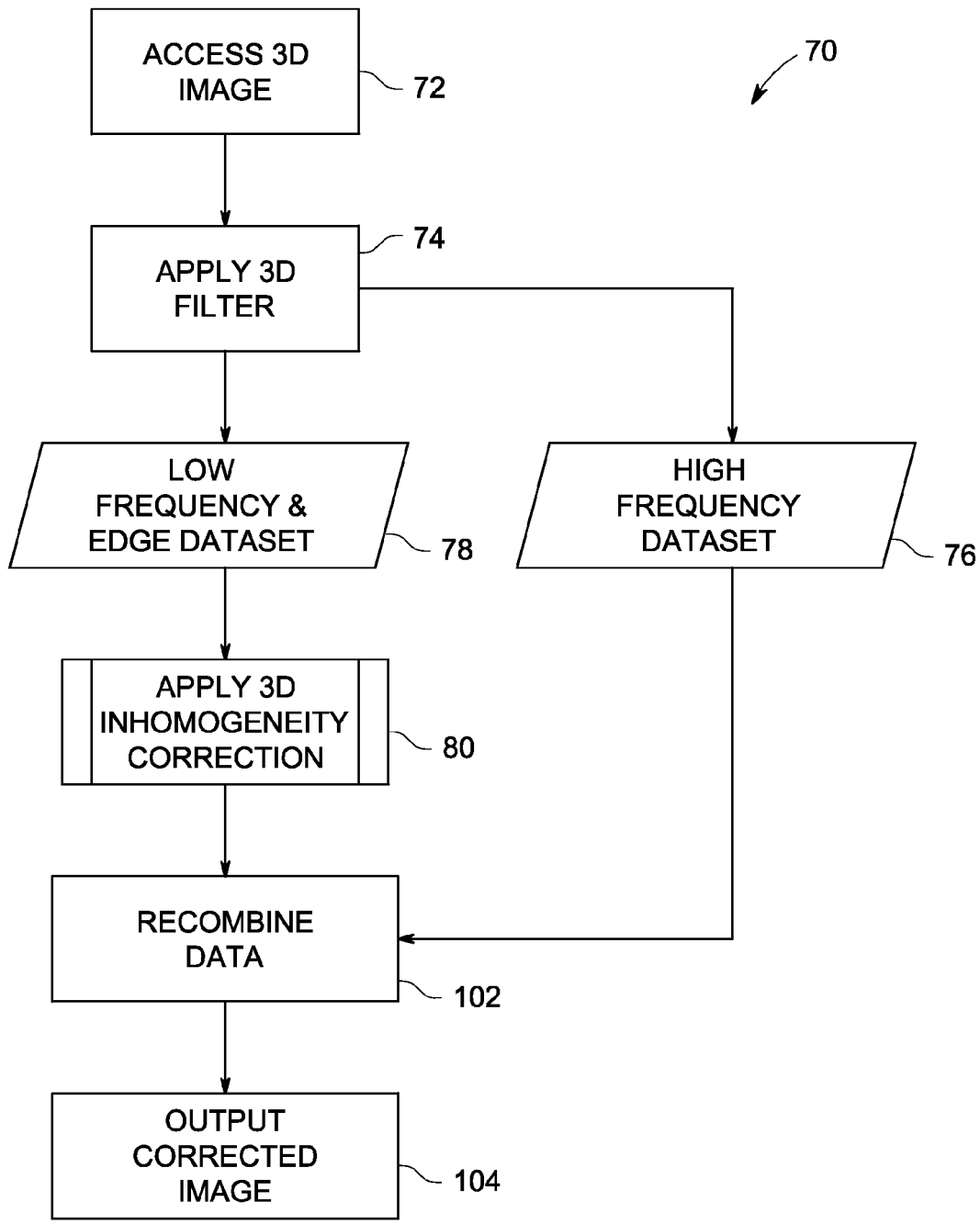
FIG. 2 is a flowchart illustrating a technique for three-dimensional inhomogeneity correction in accordance with one aspect of the present invention.

Referring to FIG. 2, a technique 70 is set forth for three-dimensional (3D) inhomogeneity correction of an MR image, in accordance with an embodiment of the present invention. Technique 70 begins at step 72 by accessing or reading a set of image data corresponding to a 3D MR image. According to one embodiment, the 3D MR image data includes data acquired using a body coil.

At step 74, a 3D filter is applied to the set of image data to separate the original image into two separate subsets of image data. According to one embodiment, technique 70 applies a 3D edge-preserving filter at step 74. The 3D filter performs anisotropic smoothing along structures that may include image edges, lines, and high-frequency textures above a predefined spatial scale. For non-structure regions, the filter performs isotropic smoothing. Thus, the transition from structure regions to non-structure regions (i.e., the transition from anisotropic to isotropic smoothing) may be set up spatially and functionally in a gradual fashion.

MR shading artifacts caused by the inhomogeneity of the static magnetic field are manifested as slow variations of image intensity. Thus, MR image inhomogeneity can be identified as a very low frequency shading across 3D space. Image data contributing to the inhomogeneity can be separated from high frequency component of the image, which is mostly fine structures of the anatomy and noise. Accordingly, technique 70 isolates or generates two sets of data 76, 78 from the 3D MR image data based on application of the 3D filter at step 74. The first set of data 76 represents a high frequency component of the image data that includes high frequency anatomical structure, such as textures, weak edge features, and noise that may be amplified during an inhomogeneity correction process. The second set of data 78 includes low frequency data as well as image data corresponding to salient or strong edge features that contain MR inhomogeneity (hereinafter the "LFSE data"). At step 80, a technique 82 is applied that corrects the LFSE data using a 3D inhomogeneity correction technique.

Figure 3:
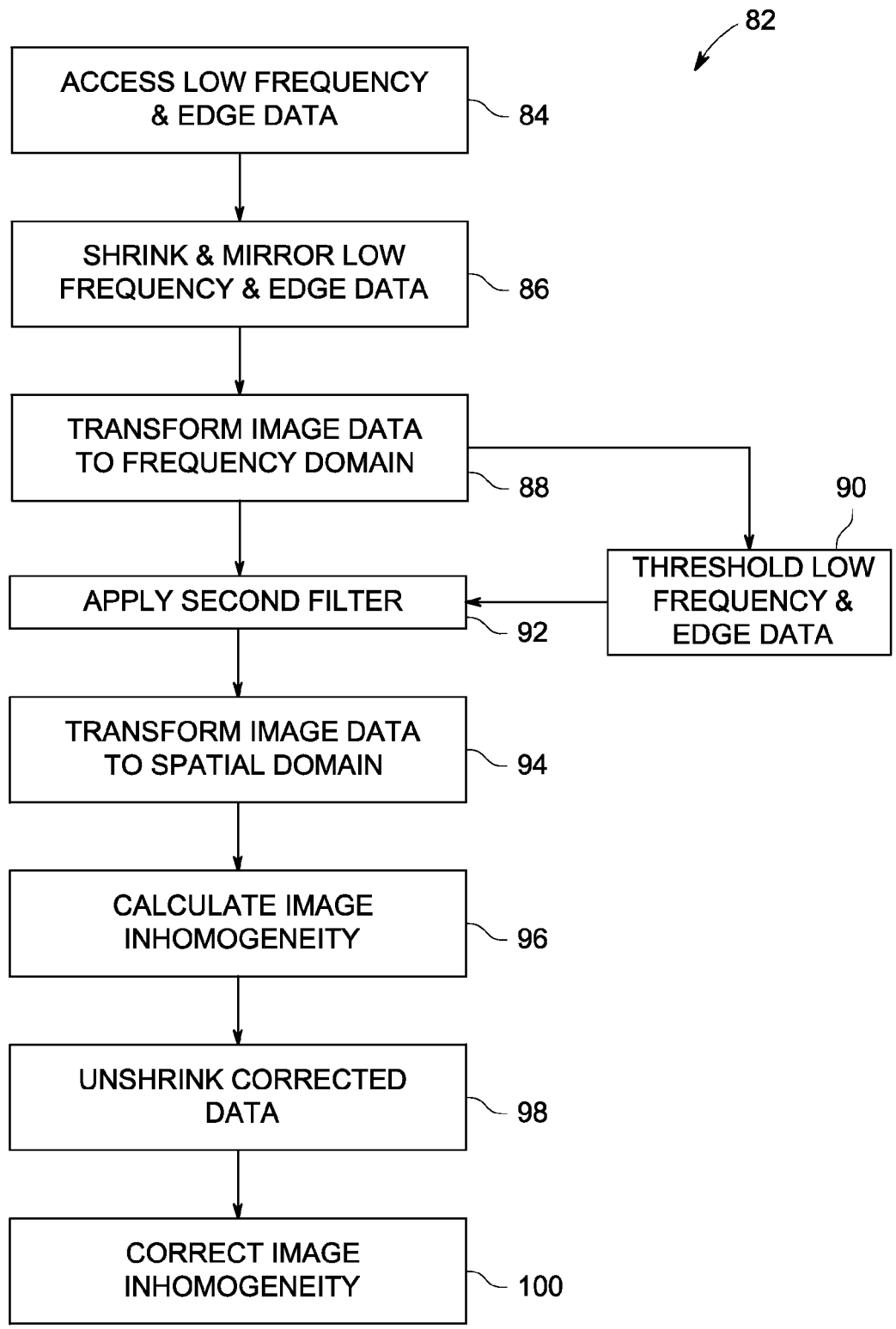
FIG. 3 is a flowchart illustrating a technique for three-dimensional inhomogeneity correction in accordance with one aspect of the present invention.

Referring to FIG. 3, technique 82 for 3D inhomogeneity correction is set forth in accordance with an embodiment of the present invention. Technique 82 begins by accessing a set of low frequency and salient edge data at step 84, such as the LFSE data identified by technique 70 at step 78. According to one embodiment, a shrinking and mirroring operation is applied to the LFSE data at step 86 to reduce the size of the data for three-dimensional processing. The shrinking operation decreases the resolution of the LFSE data by reducing the number of pixels along each edge. Technique 82 achieves this decrease in resolution by reducing edges along the x-axis and y-axis equally. Edges along the z-axis are reduced accordingly such that the resulting shrunk LFSE data is isotropic in the x, y, and z directions. For example, if technique 82 accesses 3D MR image data representing a 512×512 pixel array in the x-y plane, the shrinking operation may be used to decrease the resolution of the LFSE data in the x-y plane to a 32×32, 64×64, or 128×128 pixel array. Edges parallel to the z-axis are also reduced such that the six sides of a given pixel are isotropic. Technique 82 also mirrors data on the six x, y, and z edges at step 86 to avoid image artifacts that would be otherwise caused by a truncated image.

Next, technique 82 smoothes and thresholds the shrunk LFSE data. Specifically, at step 88, the shrunk LFSE data is passed through a three-dimensional fast Fourier transform (FFT), which transfers the image data to the frequency domain. At step 90, technique 82 applies a threshold to the shrunk LFSE data to generate a thresholded set of shrunk LFSE data. The intensity of respective pixels of the shrunk LFSE data are compared to an intensity threshold. According to one embodiment, the intensity threshold is defined based on an average of the intensities of the shrunk LFSE data.

A Gaussian filter is applied to the shrunk LFSE data and the thresholded shrunk LFSE data at step 92. According to one embodiment, the Gaussian filter is a low pass filter (LPF). At step 94, the filtered sets of shrunk LFSE data and thresholded shrunk LFSE data are transferred back to the spatial domain using an inverse fast Fourier transform (IFFT).

At step 96, a function representing inhomogeneity in the shrunk LFSE data, $h_{shrunk}$, is generated as a ratio of the low-pass filtered shrunk LFSE data and the low-pass filtered thresholded shrunk LFSE data. In generating the function $h_{shrunk}$, one or more constants may be applied to the numerator and/or denominator when calculating the ratio to improve numerical stability and avoid dividing by zero.

At step 98, technique 82 computes the inhomogeneity correction, h, for the original image data. Because the shrunk inhomogeneity function, $h_{shrunk}$, was calculated using shrunk data, the function is expanded using an interpolation process such that it matches the resolution of the original image data.

Technique 82 applies the inhomogeneity function, h, to the original low frequency data at step 100 according to the general function, ƒ, as follows:

$$f = \frac{g}{h}, \quad \text{Eqn. 1}$$

where g represents the image data and h represents the inhomogeneity correction. Thus, using Eqn. 1, the shrunk low frequency data is divided by the interpolated 3D inhomogeneity function, h, to generate a corrected low frequency component of the original image.

Referring back to FIG. 2, the corrected low frequency data is recombined with the high frequency data, which was identified at step 74, to generate a corrected image at step 102. Technique 70 outputs data representing the corrected image at step 104. Because the inhomogeneity correction is only applied to the LFSE data during technique 70, the image noise of the inhomogeneity corrected image is substantially the same as the noise of the original input image data.

Figure 4:
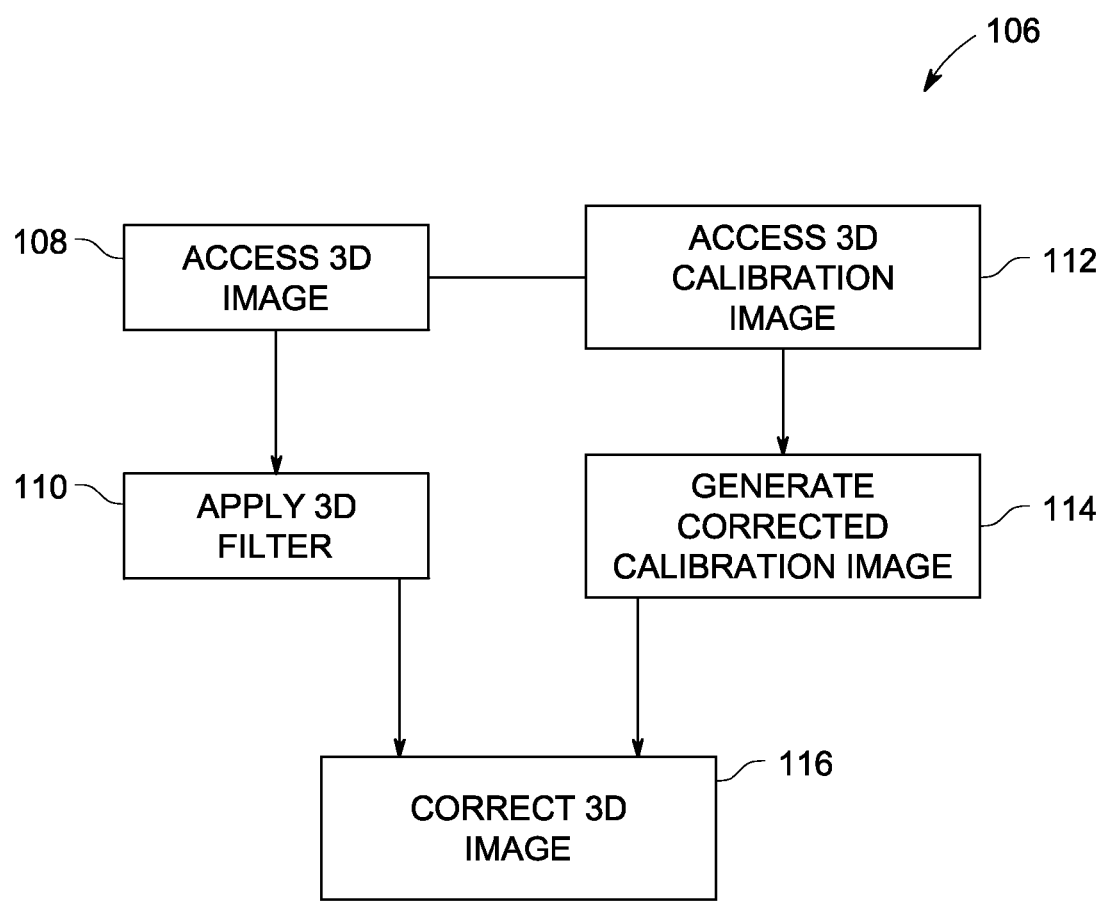
FIG. 4 is a flowchart illustrating a technique for three-dimensional inhomogeneity correction in accordance with another aspect of the present invention.

Referring now to FIG. 4, a technique 106 for image homogeneity correction is set forth that corrects 3D MR image data using a 3D inhomogeneity corrected calibration image, according to one embodiment of the invention. Technique 106 begins by accessing a set of 3D MR image data at step 108. The set of 3D MR image data is filtered three-dimensionally at step 110, using a 3D edge-preserving filter such as the filter described with respect to step 74 of FIG. 2.

Technique 106 accesses a calibration image comprising 3D MR image data at step 112. At step 114, a corrected calibration image is generated according to technique 82 of FIG. 2. At step 116, technique 106 uses the corrected calibration image to correct inhomogeneity in the filtered 3D MR image data.

By using a calibration image instead of the 3D MR image data to generate the inhomogeneity correction, technique 106 has the advantage of maintaining relative intensities in the corrected image. However, unlike the inhomogeneity correction described at step 80 of FIG. 2, the inhomogeneity correction performed at step 116 is applied to the entire set of filtered image data (i.e., the filtered low frequency components, strong edges, and high frequency components). Thus, the corrected image output at step 104 may include amplified noise.

Figure 5:
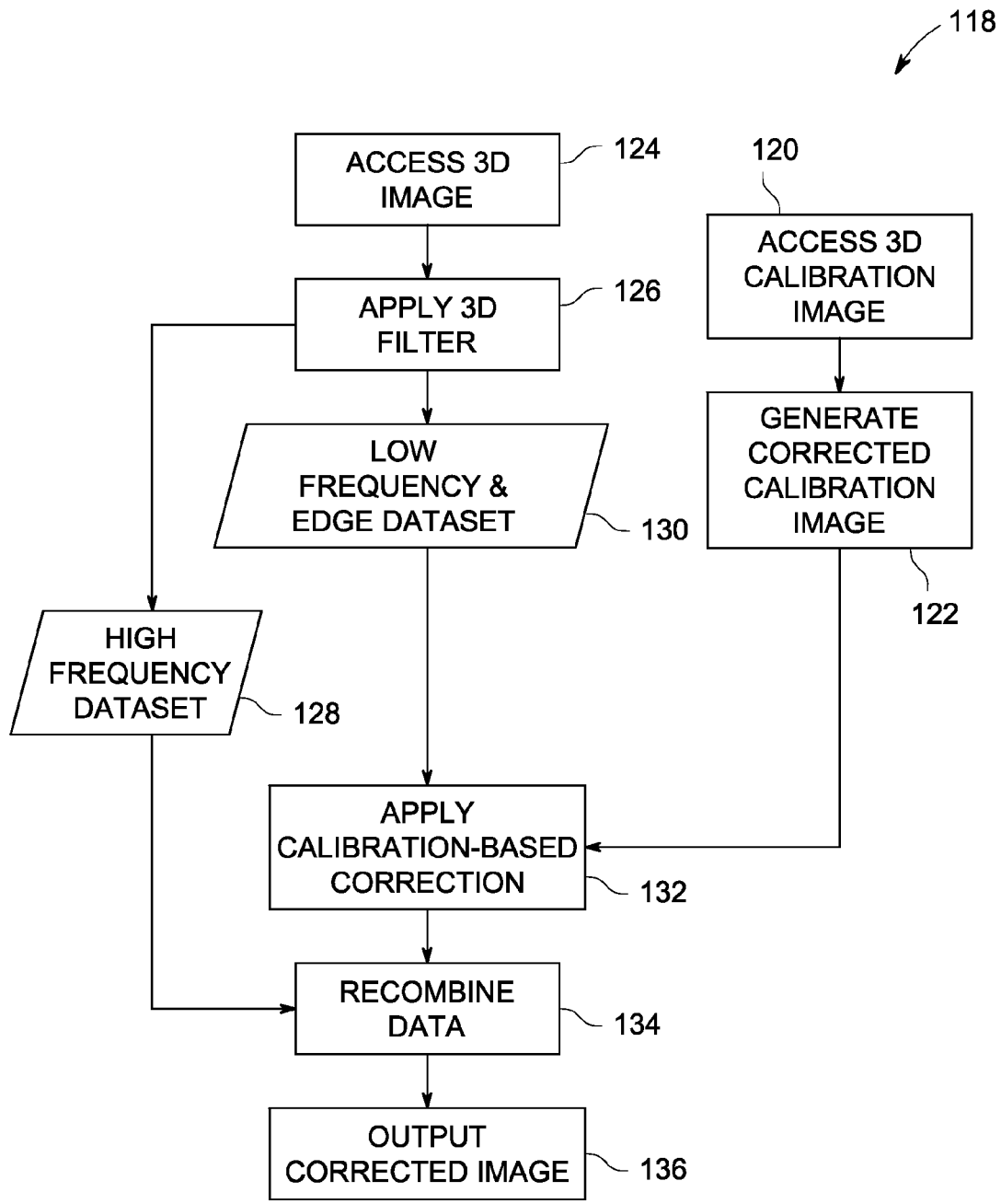
FIG. 5 is a flowchart illustrating a technique for three-dimensional inhomogeneity correction in accordance with another aspect of the present invention.

FIG. 5 illustrates another technique 118 for image homogeneity correction that includes a 3D inhomogeneity correction of a calibration image, according to an alternative embodiment of the invention. Similar to technique 106 (FIG. 4), technique 118 accesses a calibration image comprising 3D MR image data at step 120. At step 122, an inhomogeneity correction function and a corrected calibration image is generated according to technique 82 (FIG. 3).

At step 124, a set of 3D MR image data is accessed. The data is three-dimensionally filtered at step 126 in a similar manner as described with respect to step 74 (FIG. 2). Based on application of the filter, a first set of data 128 is generated that represents a high frequency component of the image data, including high frequency anatomical structure, such as textures, weak edge features, and noise that may be amplified during an inhomogeneity correction process. A second set of data 130 is also generated based on application of the filter. The second set of data 130 includes low frequency data as well as image data corresponding to salient or strong edge features (hereinafter the "LFSE data").

At step 132 technique 118 uses the inhomogeneity correction function generated at step 122 to correct the LFSE data. After the inhomogeneity correction is applied to the LFSE data, the data identified at step 128 as high frequency components is added back to the corrected LFSE data at step 134. Technique 118 outputs an inhomogeneity corrected image at step 136.

Because technique 118 defines the inhomogeneity correction using a calibration image, the relative intensities of the 3D image data is preserved through the correction process. Further, technique 118 avoids noise amplification by applying the inhomogeneity correction only to the low frequency data and the salient edge data. Accordingly, technique 118 incorporates the advantages of technique 70 (FIG. 2) and technique 106 (FIG. 4).

A technical contribution for the disclosed method and apparatus is that it provides for a computer implemented technique for correcting inhomogeneity of spatial intensity in 3D MR image data.

One skilled in the art will appreciate that embodiments of the invention may be interfaced to and controlled by a computer readable storage medium having stored thereon a computer program. The computer readable storage medium includes a plurality of components such as one or more of electronic components, hardware components, and/or computer software components. These components may include one or more computer readable storage media that generally stores instructions such as software, firmware and/or assembly language for performing one or more portions of one or more implementations or embodiments of a sequence. These computer readable storage media are generally non-transitory and/or tangible. Examples of such a computer readable storage medium include a recordable data storage medium of a computer and/or storage device. The computer readable storage media may employ, for example, one or more of a magnetic, electrical, optical, biological, and/or atomic data storage medium. Further, such media may take the form of, for example, floppy disks, magnetic tapes, CD-ROMs, DVD-ROMs, hard disk drives, and/or electronic memory. Other forms of non-transitory and/or tangible computer readable storage media not list may be employed with embodiments of the invention.

A number of such components can be combined or divided in an implementation of a system. Further, such components may include a set and/or series of computer instructions written in or implemented with any of a number of programming languages, as will be appreciated by those skilled in the art. In addition, other forms of computer readable media such as a carrier wave may be employed to embody a computer data signal representing a sequence of instructions that when executed by one or more computers causes the one or more computers to perform one or more portions of one or more implementations or embodiments of a sequence.

Therefore, in accordance with one embodiment, a computer readable storage medium has stored thereon a computer program comprising instructions which when executed by a computer cause the computer to access a three-dimensional (3D) magnetic resonance (MR) image. The instructions also cause the computer to apply a 3D filter to the 3D MR image to generate a first set of data and a second set of data. The first set of data includes a high frequency component and a weak edge component, and the second set of data includes a low frequency component and a strong edge component. Further, the instructions cause the computer to derive an inhomogeneity correction from the second set of data, apply the inhomogeneity correction to the second set of data, and add the first set of data to the inhomogeneity corrected second set of data to create a corrected 3D MR image.

In accordance with another embodiment, a method for correcting inhomogeneity in three-dimensional (3D) magnetic resonance (MR) image data includes accessing a set of 3D MR image data at a first resolution and applying a first filter to the set of 3D MR image data to isolate a first set of data and a second set of data. The first set of data includes high frequency data and the second set of data includes low frequency data and salient edge data. The method also includes computing a 3D inhomogeneity correction function from the second set of data, three-dimensionally correcting the second set of data using the 3D inhomogeneity correction function, and combining the corrected second set of data with the first set of data to generate a corrected 3D image.

In accordance with yet another embodiment, an MRI apparatus includes a magnetic resonance imaging (MRI) system having a plurality of gradient coils positioned about a bore of a magnet, and an RF transceiver system and an RF switch controlled by a pulse module to transmit RF signals to an RF coil assembly to acquire three-dimensional (3D) MR images. The MRI apparatus further includes a computer that is programmed to access an image acquired from the MRI system and apply a 3D edge preserving filter to the image to generate a pair of datasets, the pair of datasets comprising a first dataset and a second dataset. The first dataset includes high frequency data and weak edge data, and the second dataset includes low frequency data and strong edge data. The computer is also programmed to apply a 3D inhomogeneity correction to only the second dataset to obtain a corrected second dataset, combine the first dataset with the corrected second dataset, and display a corrected 3D MR image from the combined first and corrected second datasets.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A computer readable storage medium having stored thereon a computer program comprising instructions which when executed by a computer cause the computer to:
   access a three-dimensional (3D) magnetic resonance (MR) image;
   apply a 3D filter to the 3D MR image to generate a first set of data and a second set of data, wherein the first set of data comprises a high frequency component and a weak edge component, and wherein the second set of data comprises a low frequency component and a strong edge component;
   derive an inhomogeneity correction from the second set of data;
   apply the inhomogeneity correction to the second set of data; and
   add the first set of data to the inhomogeneity corrected second set of data to create a corrected 3D MR image.

2. The computer readable storage medium of claim 1 having further instructions to cause the computer to:
   decrease a resolution of the second set of data from a first resolution to a second resolution to obtain a decreased resolution dataset; and
   derive the inhomogeneity correction from the decreased resolution dataset.

3. The computer readable storage medium of claim 2 having further instructions to cause the computer to:
   expand the inhomogeneity correction based on the first resolution of the second set of data; and
   apply the expanded inhomogeneity correction to the second set of data.

4. The computer readable storage medium of claim 1 having further instructions to cause the computer to:
   define the corrected 3D MR image as a calibration image;
   access a second 3D MR image; and
   correct inhomogeneity in the second 3D MR image based on the calibration image.

5. The computer readable storage medium of claim 4 having further instructions to cause the computer to:
apply a 3D filter to the second 3D MR image to generate a third set of data and a fourth set of data, wherein the third set of data includes a high frequency component and a weak edge component and the fourth set of data includes a low frequency component and a strong edge component;
define an inhomogeneity correction from the calibration image;
apply the inhomogeneity correction to the fourth set of data to obtain a corrected fourth set of data; and
combine the third set of data with the corrected fourth set of data.

6. The computer readable storage medium of claim 4 having further instructions to cause the computer to:
define an inhomogeneity correction from the calibration image; and
apply the inhomogeneity correction to low and high frequency components in the second 3D MR image.

7. A method for correcting inhomogeneity in three-dimensional (3D) magnetic resonance (MR) image data comprising:
accessing a set of 3D MR image data at a first resolution;
applying, by a computer processor, a first filter to the set of 3D MR image data to isolate a first set of data and a second set of data, the first set of data comprising high frequency data and the second set of data comprising low frequency data and salient edge data;
computing a 3D inhomogeneity correction function from the second set of data;
three-dimensionally correcting, by the computer processor, the second set of data using the 3D inhomogeneity correction function; and
combining, by the computer processor, the corrected second set of data with the first set of data to generate a corrected 3D image.

8. The method of claim 7 further comprising:
reducing a resolution of second set of data to a second resolution, lower than the first resolution, to shrink the second set of data;
smoothing the shrunk second set of data; and
computing the 3D inhomogeneity correction function from the shrunk second set of data.

9. The method of claim 8 further comprising interpolating the 3D inhomogeneity correction such that a resolution of the 3D inhomogeneity correction matches the first resolution.

10. The method of claim 8 further comprising:
defining a threshold based on an average of the shrunk second set of data;
applying the threshold to the shrunk second set of data to obtain a thresholded shrunk second set of data; and
computing the 3D inhomogeneity correction using the shrunk second set of data and the thresholded shrunk second set of data.

11. The method of claim 10 further comprising:
applying a low pass filter to the shrunk second set of data and the thresholded shrunk second set of data; and
generating the 3D inhomogeneity correction based on a ratio of the low pass filtered shrunk second set of data and the low pass filtered thresholded shrunk low frequency data.

12. The method of claim 7 wherein applying the first filter comprises applying a 3D edge preserving filter.

13. The method of claim 7 further comprising:
defining the corrected 3D image as a calibration image;
accessing a second set of 3D MR image data; and
correcting inhomogeneity in the second set of 3D MR image data using the calibration image.

14. The method of claim 13 further comprising:
applying an edge-preserving filter to the second set of 3D MR image data;
defining an inhomogeneity correction from the calibration image; and
correcting inhomogeneity in the filtered second set of 3D MR image data using the inhomogeneity correction from the calibration image.

15. The method of claim 14 further comprising:
identifying a set of low frequency data and salient edge data in the second set of 3D MR image data based on the application of the edge-preserving filter; and
applying the inhomogeneity correction from the calibration image only to the identified set of low frequency data and salient edge data in the second set of 3D MR image data.

16. An MRI apparatus comprising:
a magnetic resonance imaging (MRI) system having a plurality of gradient coils positioned about a bore of a magnet, and an RF transceiver system and an RF switch controlled by a pulse module to transmit RF signals to an RF coil assembly to acquire three-dimensional (3D) MR images; and
a computer programmed to:
access an image acquired from the MRI system;
apply a 3D edge preserving filter to the image to generate a pair of datasets, the pair of datasets comprising a first dataset and a second dataset, wherein the first dataset includes high frequency data and weak edge data, and wherein the second dataset includes low frequency data and strong edge data;
apply a 3D inhomogeneity correction to only the second dataset to obtain a corrected second dataset;
combine the first dataset with the corrected second dataset; and
display a corrected 3D MR image from the combined first and corrected second datasets.

17. The MRI apparatus of claim 16 wherein the computer is further programmed to:
access a second image acquired from the MRI system; and
apply the 3D inhomogeneity correction to the second image to correct inhomogeneity in the second image.

18. The MRI apparatus of claim 16 wherein the computer is further programmed to shrink the second dataset to obtain a shrunk second dataset such that the shrunk second dataset has a resolution lower than a resolution of the acquired 3D MR image.

19. The MRI apparatus of claim 18 wherein the computer is further programmed to derive a shrunk 3D inhomogeneity correction from the shrunk second dataset.

20. The MRI apparatus of claim 19 wherein the computer is further programmed to expand the shrunk 3D inhomogeneity correction to generate the 3D inhomogeneity correction.

* * * * *